United States Patent
Tu et al.

(10) Patent No.: US 9,312,482 B2
(45) Date of Patent: Apr. 12, 2016

(54) RESISTANCE VARIABLE MEMORY STRUCTURE AND METHOD OF FORMING THE SAME

(71) Applicant: TAIWAN SEMICONDUCTOR MANUFACTURING COMPANY, LTD., Hsinchu (TW)

(72) Inventors: Kuo-Chi Tu, Hsinchu (TW); Chih-Yang Chang, Yuanlin Township (TW); Hsia-Wei Chen, Taipei (TW); Yu-Wen Liao, New Taipei (TW); Chin-Chieh Yang, New Taipei (TW); Wen-Ting Chu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 13/896,064

(22) Filed: May 16, 2013

(65) Prior Publication Data
US 2014/0264234 A1    Sep. 18, 2014

Related U.S. Application Data

(60) Provisional application No. 61/799,092, filed on Mar. 15, 2013.

(51) Int. Cl.
*H01L 45/00* (2006.01)
*H01L 27/24* (2006.01)

(52) U.S. Cl.
CPC .............. *H01L 45/146* (2013.01); *H01L 45/08* (2013.01); *H01L 45/1675* (2013.01); *H01L 45/1616* (2013.01)

(58) Field of Classification Search
CPC ...... H01L 27/24; H01L 45/04; H01L 45/1233; H01L 45/124; H01L 45/1253; H01L 45/1683
USPC ............. 257/2–5, E27.004, E45.001–E45.003
See application file for complete search history.

(56) References Cited

U.S. PATENT DOCUMENTS

| | | | |
|---|---|---|---|
| 6,507,061 B1 * | 1/2003 | Hudgens et al. | 257/295 |
| 6,849,891 B1 | 2/2005 | Hsu et al. | |
| 7,169,637 B2 | 1/2007 | Zhang et al. | |
| 7,407,858 B2 | 8/2008 | Li et al. | |
| 7,786,461 B2 * | 8/2010 | Lung | 257/2 |

(Continued)

OTHER PUBLICATIONS

Wong, H.-S. Philip, et al., "Metal-Oxide RRAM", vol. 100, No. 6, Jun. 2012, Proceedings of the IEEE, pp. 1951-1970.

(Continued)

*Primary Examiner* — Allison P Bernstein
(74) *Attorney, Agent, or Firm* — Haynes and Boone, LLP

(57) ABSTRACT

A semiconductor structure includes a memory region. A memory structure is disposed on the memory region. The memory structure includes a first electrode, a resistance variable layer, a protection material and a second electrode. The first electrode has a top surface on the memory region. The resistance variable layer has at least a first portion and a second portion. The first portion is disposed over the top surface of the first electrode and the second portion extends upwardly from the first portion. The protection material surrounds the second portion of the resistance variable layer. The protection material is configurable to protect at least one conductive path in the resistance variable layer. The second electrode is disposed over the resistance variable layer.

20 Claims, 7 Drawing Sheets

(56) References Cited

U.S. PATENT DOCUMENTS

| | | |
|---|---|---|
| 7,795,606 B2 | 9/2010 | Jin et al. |
| 8,000,128 B2 | 8/2011 | Li et al. |
| 8,009,454 B2 | 8/2011 | Lee et al. |
| 2005/0263829 A1* | 12/2005 | Song et al. .................... 257/379 |
| 2010/0051896 A1* | 3/2010 | Park et al. ........................ 257/4 |
| 2010/0110758 A1 | 5/2010 | Li et al. |
| 2011/0220862 A1* | 9/2011 | Arita et al. ....................... 257/4 |
| 2011/0291064 A1 | 12/2011 | Marsh et al. |

OTHER PUBLICATIONS

Chien, W.C., et al., "Multi-Layer Sidewall WOx Resistive Memory Suitable for 3D ReRAM", 2012 Symposium on VLSI Technology Digest of Technical Papers, pp. 153-154.

* cited by examiner

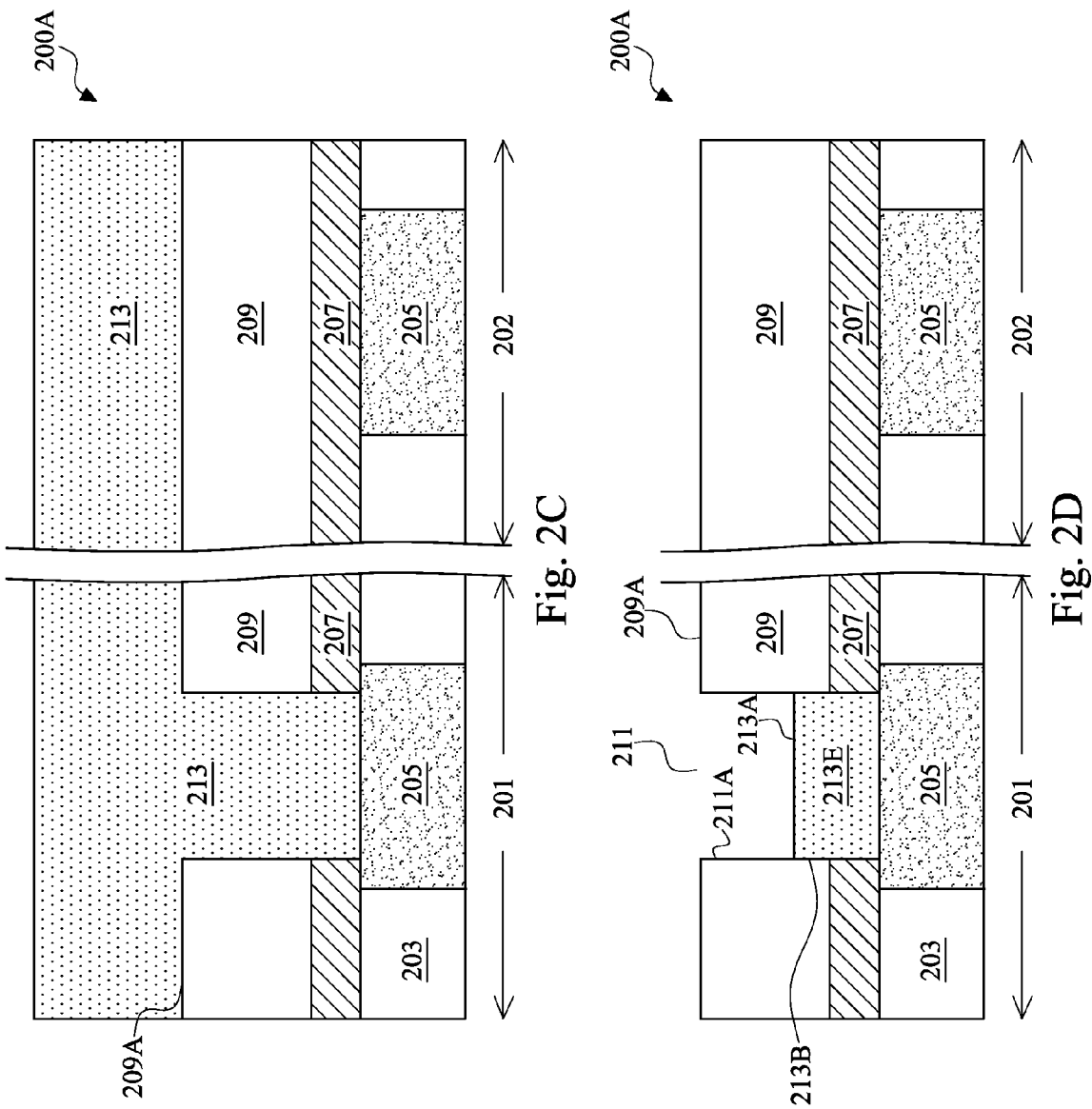

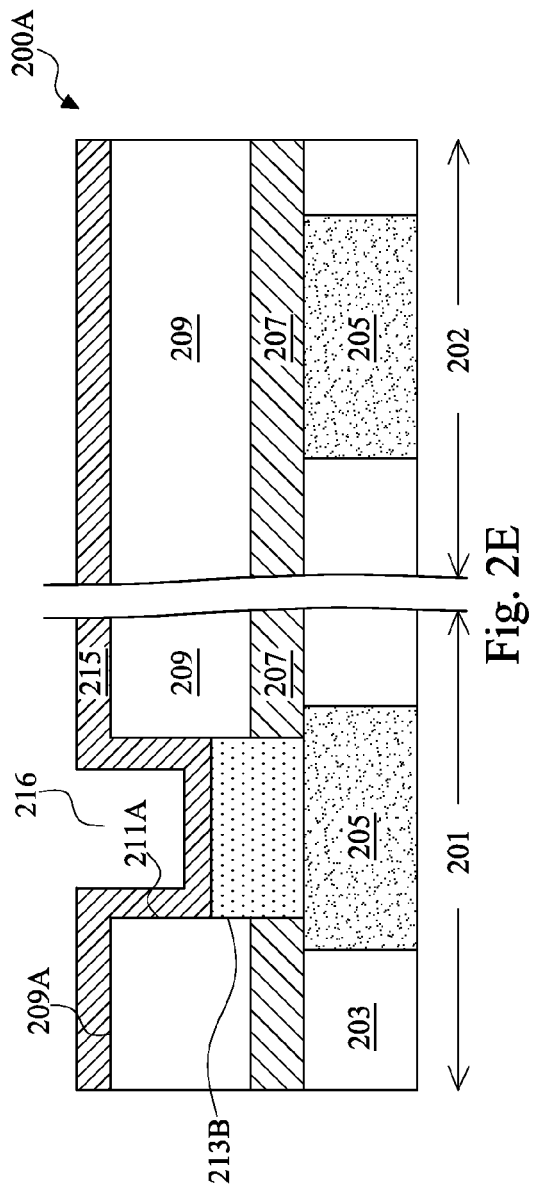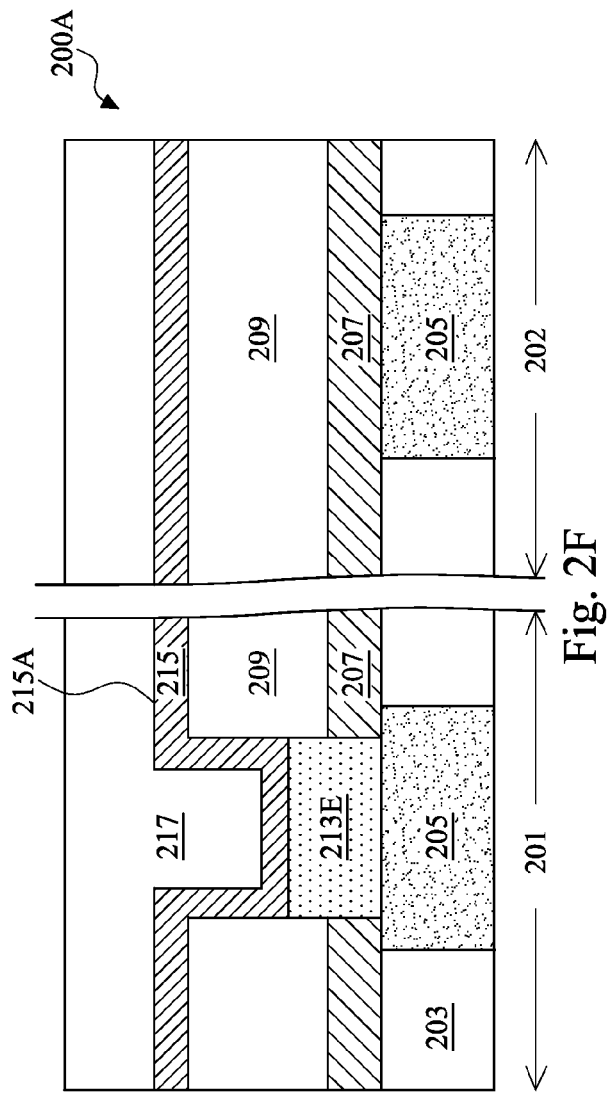

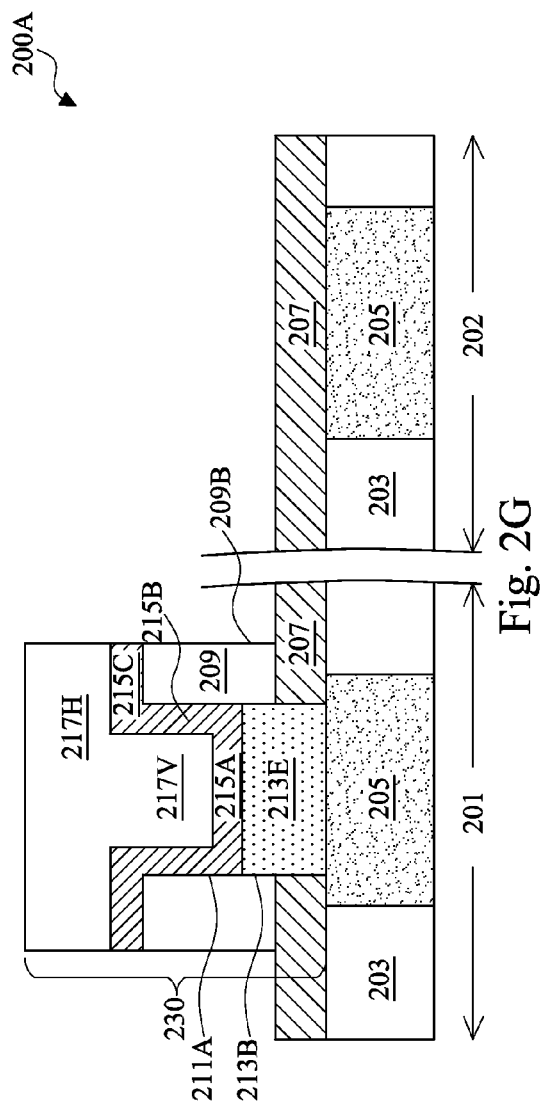
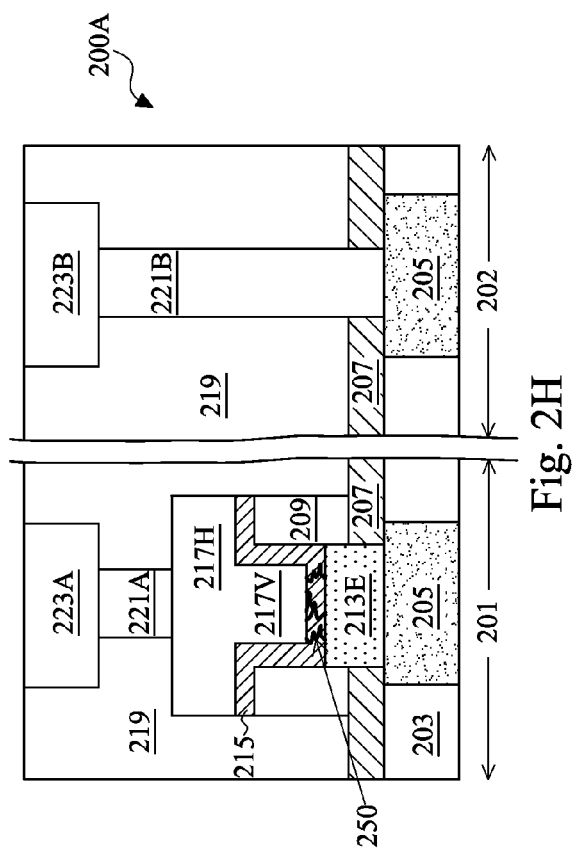

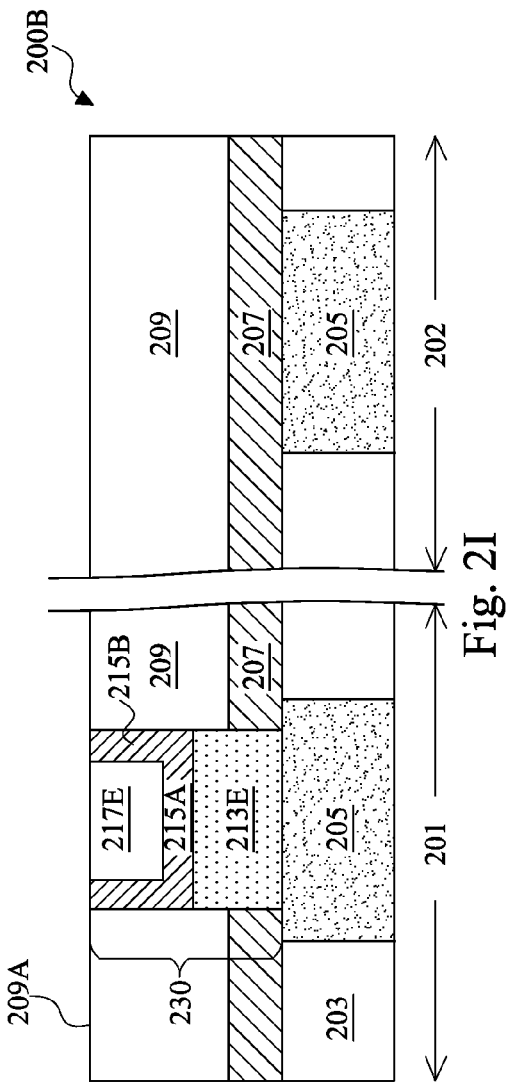
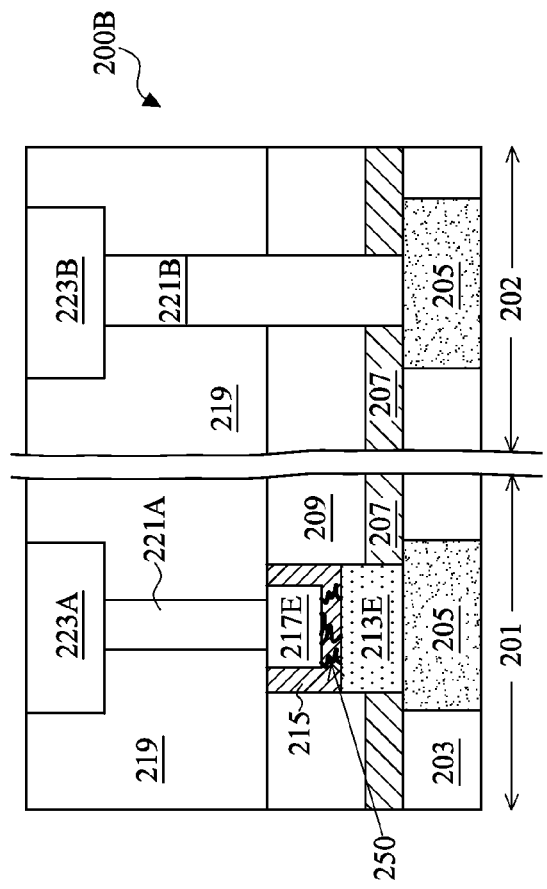

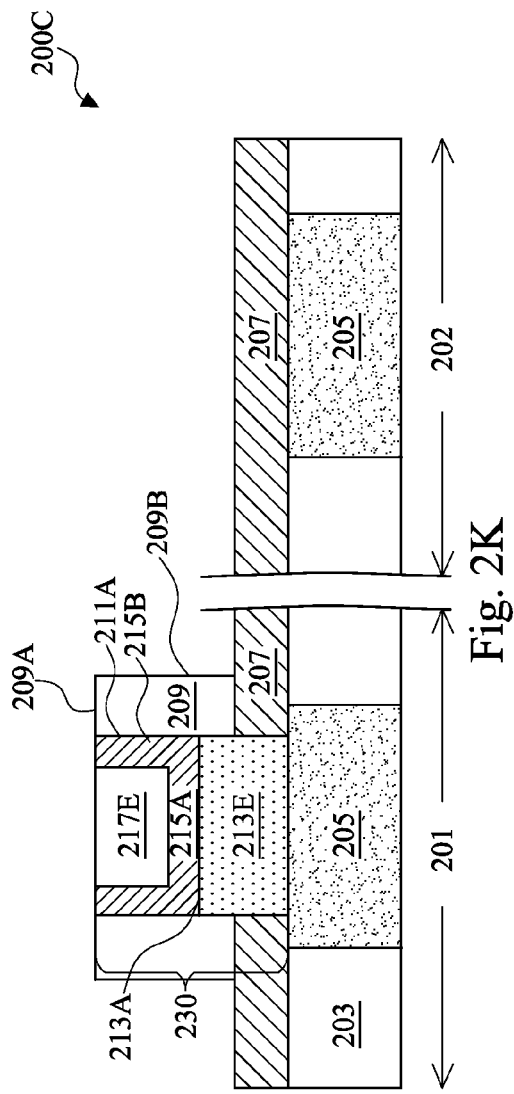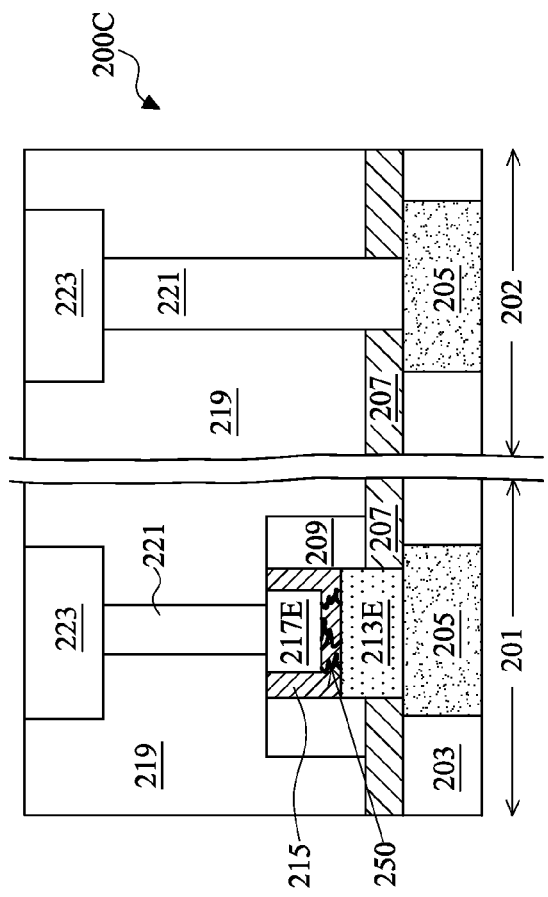

RESISTANCE VARIABLE MEMORY STRUCTURE AND METHOD OF FORMING THE SAME

PRIORITY CLAIM

This application claims the benefit of U.S. Provisional Application No. 61/799,092 entitled "RESISTANCE VARIABLE MEMORY STRUCTURE AND METHOD OF FORMING THE SAME" filed Mar. 15, 2013, herein incorporated by reference in its entirety.

TECHNICAL FIELD

This disclosure relates generally to a semiconductor structure and, more particularly, to a resistance variable memory structure and method of forming a resistance variable memory structure.

BACKGROUND

In integrated circuit (IC) devices, resistive random access memory (RRAM) is an emerging technology for next generation non-volatile memory devices. Generally, RRAM typically use a dielectric material, which although normally insulating can be made to conduct through a filament or conduction path formed after application of a specific voltage. Once the filament is formed, it may be set (i.e., re-formed, resulting in a lower resistance across the RRAM) or reset (i.e., broken, resulting in a high resistance across the RRAM) by appropriately applied voltages. The low and high resistance states can be utilized to indicate a digital signal of "1" or "0" depending upon the resistance state, and thereby provide a non-volatile memory cell that can store a bit.

From an application point of view, RRAM has many advantages. RRAM has a simple cell structure and CMOS logic comparable processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2L are cross-sectional views of semiconductor structures having a resistance variable memory structure at various stages of manufacture according to one or more embodiments of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, the semiconductor structure having a resistance variable memory structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
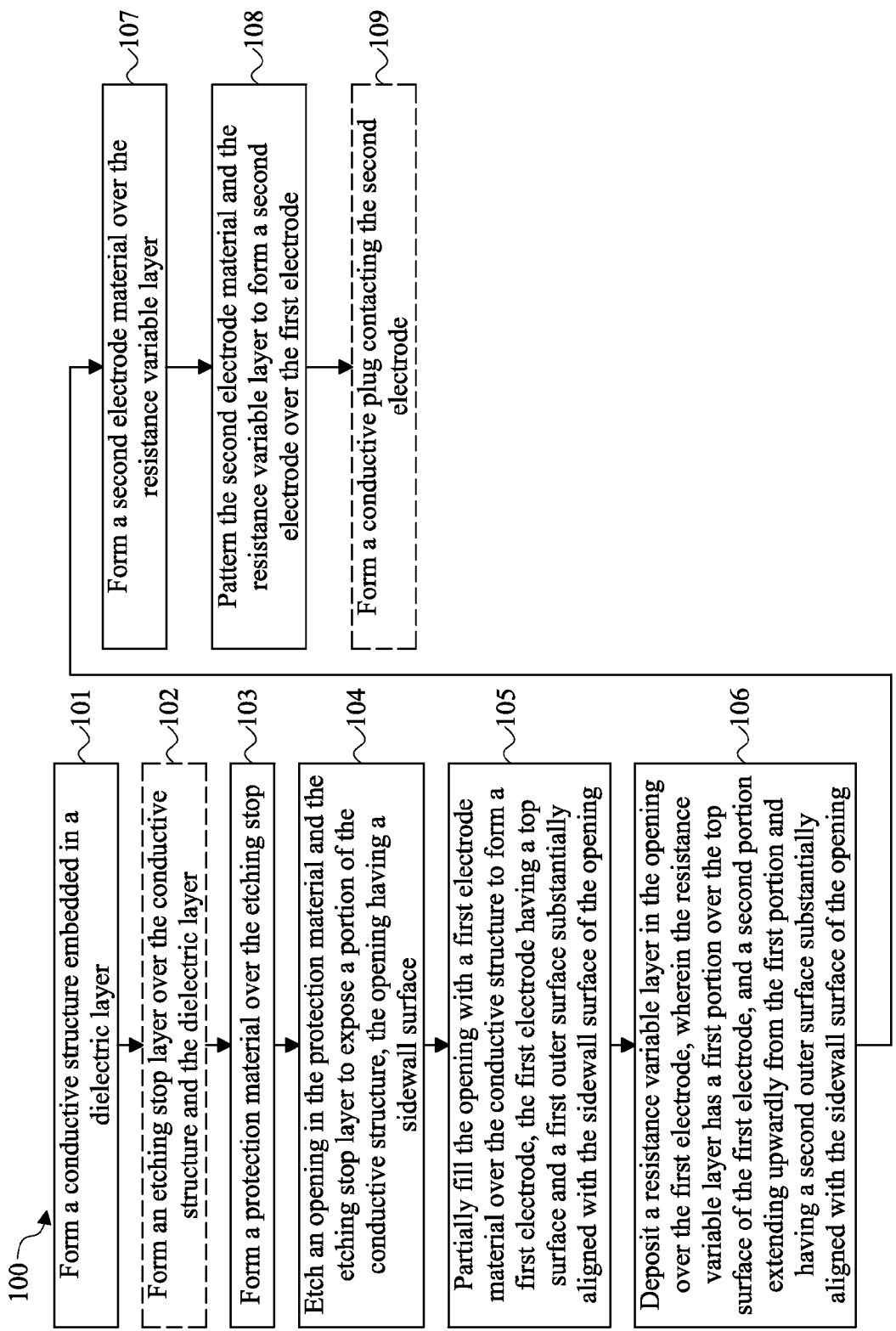
FIG. 1 is a flowchart of a method of forming a semiconductor structure having a resistance variable memory structure according to at least one embodiment of this disclosure.

FIG. 1 is a flowchart of a method 100 of forming a semiconductor structure having a resistance variable memory structure according to at least one embodiment of this disclosure.

FIGS. 2A to 2L are cross-sectional views of semiconductor structures (200A, 200B and 200C) having a resistance variable memory structure at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operation 101. A conductive structure is formed embedded in a dielectric layer. In at least one embodiment, the dielectric layer includes multiple dielectric layers formed over a substrate. At least one conductive structure is formed over the substrate and embedded in multiple dielectric layers. The method 100 continues with operation 102 in which an etching stop layer is optionally formed over the conductive structure and the dielectric layer. The method 100 continues with operation 103 in which a protection material is formed over the etching stop layer.

Figure 2A:
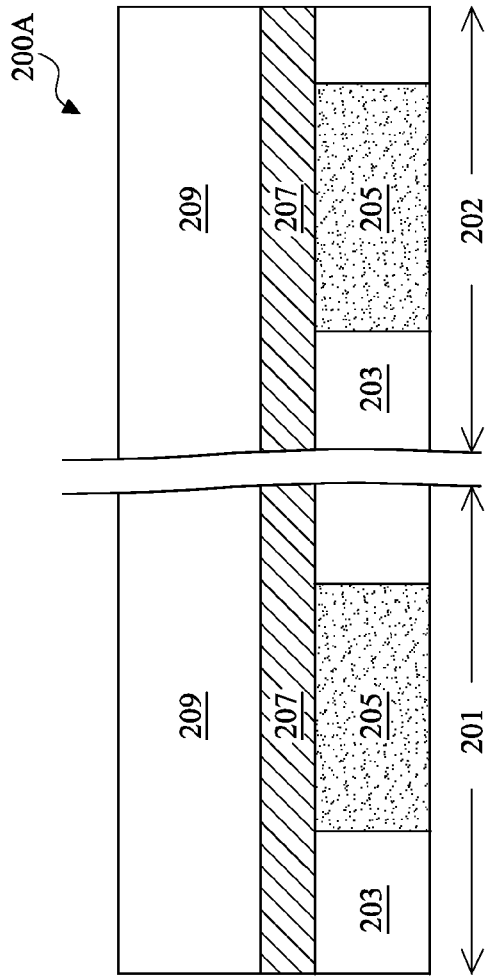

Referring to FIG. 2A, which is an enlarged cross-sectional view of a portion of a semiconductor structure 200A having a resistance variable memory structure after performing operations 101-103. The semiconductor structure 200A includes a substrate (not shown) such as a silicon carbide (SiC) substrate, GaAs, InP, Si/Ge or a silicon substrate. In some embodiments, the substrate includes a plurality of layers formed over a top surface of the substrate. Examples of the layers include dielectric layers, doped layers, polysilicon layers or conductive layers. The substrate further includes a plurality of device structures formed within the plurality of layers. Examples of the device structures include transistors, resistors, and/or capacitors.

In the illustrated examples of FIGS. 2A-2H, the semiconductor structures 200A include a dielectric layer 203 formed over a top surface of the substrate (not shown) in a memory region 201 and a periphery region 202. The dielectric layer 203 comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. The formation process may include chemical vapor deposition (CVD), atomic layer deposition (ALD), high density plasma CVD (HDPCVD) or spin-on glass (SOG).

A conductive structure 205 is formed embedded in the dielectric layer 203 in each memory region 201 and periphery region 202. In certain embodiments, the conductive structure 205 includes a conductive interconnect, a doped region or a silicide region. In some embodiments, the conductive structure 205 includes Al, Cu, Ti, Ta, W, Mo, TaN, NiSi, CoSi, TiN, WN, silicon or combinations thereof. In the illustrated example of FIG. 2A, the semiconductor structure 200A may be formed by lithography patterning and etching in the dielectric layer 203. A metal layer deposition and planarization processes are performed over the dielectric layers 203 to form the conductive structure 205. A top surface of the conductive structure 205 is substantially coplanar with a top surface the dielectric layer 203.

An etching stop layer 207 is optionally formed over the conductive structure 205 and the dielectric layer 203 in the memory region 201 and the periphery region 202. The etching stop layer 207 halts an etching process from proceeding further down into the dielectric layers 203 and the conductive structure 205 during a formation stage for a second electrode shown in FIG. 2G. The etching stop layer 207 formed over the top surface of the conductive structure 205 prevents the conductive structure 205 from being oxidized. Also, the etching stop layer 207 formed over the top surface of the conductive structure 205 prevents the substance in the conductive structure 205 from diffusing out to contaminate other layers during the formation stage for the second electrode shown in FIG. 2G. In certain embodiments, the etching stop layer 207 includes a dielectric material such as silicon carbide or silicon oxy-nitride. The formation process may include chemical vapor deposition (CVD), atomic layer deposition (ALD) or plasma enhanced CVD (PECVD).

A protection material 209 is formed over the conductive structure 205 and the dielectric layer 203, and over the etching stop layer 207 (if the etching stop layer 207 exists). The protection material 209 includes a substantially oxygen-free dielectric material. In certain embodiments, the protection material 209 includes silicon nitride. The protection material 209 may protect conductive paths between the following formed first electrode and second electrode and enhance the electrical characteristic stability for the resistance variable memory structure. A further explanation would be described below.

Referring back to FIG. 1, method 100 continues with operation 104. In operation 104, an opening is formed in the protection material and the etching stop layer to expose a portion of the conductive structure. The opening has a sidewall surface.

Figure 2B:
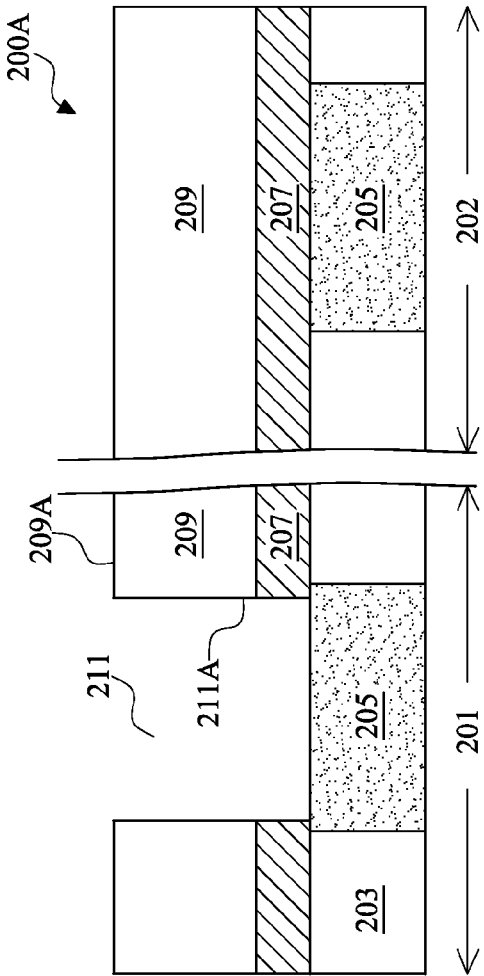

Referring to FIG. 2B, which is a cross-sectional view of a portion of the semiconductor structure 200A after performing operation 104. In the memory region 201, an opening 211 is etched in the protection material 209 (also the etching stop layer 207) to expose a portion of the conductive structure 205. The opening 211 has an interior sidewall surface 211A. The opening 211 is formed by suitable process, including lithography patterning, and etching processes.

Referring back to FIG. 1, method 100 continues with operation 105. In operation 105, the opening is partially filled with a first electrode material over the conductive structure to form a first electrode. In at least one embodiment, the opening is filled with the first electrode material to less than a top surface of the dielectric layer. The first electrode has a top surface and a first outer surface which is substantially aligned with the sidewall surface of the opening.

FIGS. 2C and 2D are cross-sectional views of the semiconductor structure 200A after performing operation 105. In FIG. 2C, a first electrode material 213 is overfilled in the opening 211 in the memory region 201. The first electrode material 213 also forms over a top surface 209A of the protection material 209 in the memory region 201 and in the periphery region 202. Possible formation methods include electroless plating, sputtering, electro plating, PVD or ALD. The first electrode material 213 includes a conductive material having a proper work function such that a high work function wall is built between a subsequently formed first electrode and a resistance variable layer. The first electrode material 213 may comprise Pt, AlCu, TiN, Au, Ti, Ta, TaN, W, WN, Cu or combinations thereof. In some embodiments, the excess first electrode material 213 outside the opening 211 is removed through a suitable planarization process such as CMP to reduce a thickness of the first electrode material 213 about 30 Å to 500 Å above the top surface 209A of the protection material 209.

In FIG. 2D, the first electrode material 213 is etching back to form a first electrode 213E filled in a bottom section of the opening 209 in the memory region 201. The first electrode material 213 in the periphery region 202 is completely removed. The first electrode 213E is electrically connected to an underlying transistor through the conductive structure 205. The first electrode 213E is surrounded by the protection material 209 and the etching stop layer 207. The first electrode 213E has a top surface 213A and a first outer surface 213B. In certain embodiments, the planarization process is performed on the first electrode material 213 to create a substantially flat top surface and the etching back process reduces the thickness of the first electrode material 213 in the opening 211 to duplicate a substantially flat top surface 213A for the first electrode 213E. Due to first electrode material 213 filled in the opening 211, the first outer surface 213B of the first electrode 213E is substantially aligned with the interior sidewall surface 211A of the opening 211.

Referring back to FIG. 1, method 100 continues with operation 106. In operation 106, a resistance variable layer is deposited in the opening over the first electrode. The resistance variable layer has a first portion and a second portion. The first portion is over the top surface of the first electrode. The second portion extends upwardly from the second portion and has a second outer surface substantially aligned with the sidewall surface of the opening.

FIG. 2E is a cross-sectional view of the semiconductor structure 200A after performing operation 106. In some embodiments, a resistance variable layer 215 is conformally deposited over the top surface 209A of the protection material 209 and along the interior sidewall surface 211A of the opening 211, and over the top surface 213A of the first electrode 213. After the formation of the resistance variable layer 215, the opening 211 partially filled with the resistance variable layer 215 becomes a remaining opening 216. The resistance variable layer 215 has a resistivity capable of switching between a high resistance state and a low resistance state (or conductive), by application of an electrical voltage. In various embodiments, the resistance variable layer 215 includes at least one of dielectric materials comprising a high-k dielectric material, a binary metal oxide and a transition metal oxide. In some embodiments, the resistance variable layer 215 includes nickel oxide, titanium oxide, hafnium oxide, zirconium oxide, zinc oxide, tungsten oxide, aluminum oxide, tantalum oxide, molybdenum oxide or copper oxide. Possible formation methods include pulse laser deposition (PLD) or ALD, such as ALD with a precursor containing zirconium and oxygen. In one example, the resistance variable layer 215 has a thickness in a range from about 10 Å about 500 Å.

Referring back to FIG. 1, method 100 continues with operation 107. In operation 107, a second electrode material is formed over the resistance variable layer.

FIG. 2F is a cross-sectional view of the semiconductor structure 200A after performing operation 107. A second electrode material 217 is deposited over the resistance variable layer 215 and overfills the opening 216. The second electrode material 217 may include suitable conductive materials to electrically connect a subsequently formed resistance variable memory structure to other portions of an interconnect structure for electrical routing. The second electrode material 217 may comprise Pt, AlCu, TiN, Au, Ti, Ta, TaN, W, WN, Cu or combinations thereof. In at least one example, the second electrode material 217 has a thickness above a top surface 215A of the resistance variable layer 215 in a range from about 30 Å about 3000 Å. In some embodiments, the first electrode material 213 and the second electrode material 217 have a same composition. In some embodiments, the first electrode material 213 and the second electrode material 217 have different compositions. Possible formation methods for the second electrode material 217 include electroless plating, sputtering, electro plating, PVD or ALD.

Referring back to FIG. 1, method 100 continues with operation 108. In operation 108, the second electrode material and the resistance variable layer is patterned to form a second electrode over the first electrode.

FIG. 2G is a cross-sectional view of the semiconductor structure 200A after performing operation 108. A resistance variable memory structure 230 is formed in the memory region 201 by suitable patterning processes, including lithography patterning, and etching processes. The etching stop layer 207 may cease the etching processes further go down to the dielectric layers 203 and the conductive structure 205 during a formation stage for a second electrode (217A and 217H). In the periphery region 201, all the layers above the etching stop layer 207 are removed.

The resistance variable memory structure 230 includes the first electrode 213E, a resistance variable layer 215A-C, a protection material 209 and the second electrode (217V and 217H). The first electrode 213E is surrounded by the etching stop layer 207 and the protection material 209. The resistance variable layer 215A-C has a first portion 215A, a second portion 215B and a third portion 215C. The first portion 215A is disposed over the top surface 213A of the first electrode 213E. The second portion 215B extends upwardly from the first portion 215A. The third portion 215C extends horizontally away from the second portion 215B, beyond an edge of the first electrode 213E, and overlies the top surface 209A of the protection material 209. The second electrode (217V and 217H) comprises a vertical portion 217V and a horizontal portion 217H. The vertical portion 217V extends into an opening surrounded by the second portion 215B of the resistance variable layer. The horizontal portion 217H extends beyond the second outer sidewall surface 211B of the second portion 215B of the resistance variable layer. The protection material 209 has the interior sidewall surface 211A and an outer sidewall surface 209B. The interior sidewall surface 211A of the protection material 209 is substantially aligned with the first outer sidewall surface 213B of the first electrode 213E and the second outer sidewall surface 211B of the second portion 215B of the resistance variable layer. The outer sidewall surface 209B of the protection material 209 is substantially aligned with edges of the third portion 215C of the resistance variable layer and substantially aligned with edges of horizontal portion 217H of the second electrode.

Referring back to FIG. 1, the method 100 optionally continues with operation 109 in which a conductive plug is formed contacting the second electrode.

FIG. 2H is a cross-sectional view of the semiconductor structure 200A after performing operation 109. An inter-level dielectric (ILD) layer 219 may be blanket formed over the memory region 201 and the periphery region 202 shown in FIG. 2G. A chemical mechanical polishing (CMP) process is further applied to the semiconductor structure 200A to planarize the ILD layer 219. The ILD layer 219 may include multiple dielectric layers. The ILD layer 219 may comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, spin-on glass (SOG), low-k dielectric material, or combinations thereof.

In certain embodiments, a dual damascene process is performed in the ILD layer 219 to form conductive wires 223A-B and contact plugs 221A-B in the memory region 201 and the periphery region 202. The conductive wires 223A-B in the memory region 201 and the periphery region 202 are in a same second metal line layer above an underlying first metal line layer. In the memory region 201, the resistance variable memory structure 230 is interposed between the first metal line layer and the second metal line layer. The contact plugs 221A contacts the horizontal portion 217H of the second electrode and connects to the conductive wires 223A in the second metal line layer. In the periphery region 202, none device structure is interposed between the first metal line layer and the second metal line layer. The device structure includes diode, transistor, PN junction, resistor, capacitor or inductor. The contact plug 221B connects the conductive wires 223B in the second metal line layer and the conductive structure 205. In some embodiments, the conductive structure 205 is a conductive wire in the first metal line layer. In certain embodiments, the conductive structure 205 is a contact plug above a conductive wire in the first metal line layer. A conductive material of the conductive wires 223A-B and contact plugs 221A-B includes copper, copper alloys, aluminum or tungsten.

Advantageously, the resistance variable memory structure 230 may be formed using, at least in part, some of the same process steps that simultaneously form desire structures in the periphery region 202 (or logic region) of the semiconductor structure 200A. The manufacturing complexity and cost are reduced in accordance with some embodiments.

FIG. 2H also illustrates the resistance variable memory structure 230 in various operations for data storage. In a "forming" operation, a "forming" voltage is applied to the first and second electrodes 213E and 217H, respectively. The "forming" voltage is high enough to generate a conductive portion in the first portion 215A of the resistance variable layer. In one example, the conductive portion includes one or more conductive filaments 250 to provide a conductive path such that the first portion 215A of the resistance variable layer shows an "on" or low resistance state. The conductive path may be related to the lineup of the defect (e.g. oxygen) vacancies in the first portion 215A of the resistance variable layer. In some embodiments, the "forming" voltage is applied only one time. Once the conductive path is formed, the conductive path will remain present in the resistance variable layer 215A. Other operations (reset operation and set operation) may disconnect or reconnect the conductive path using smaller voltages or different voltages.

Advantageously, the protection material 209 includes a substantially oxygen-free dielectric material. The protection material 209 surrounds the first portion 215A and second portion 215B of the resistance variable layer, and a top portion of the first electrode 213E. The protection material 209 may prevent the lineup of the defect (e.g. oxygen) vacancies for conductive paths 250 in the second portion 215B disturbed by oxygen atoms from adjacent layers. The electrical characteristic stability and reliability for the resistance variable memory structure 200A is enhanced.

FIGS. 2I to 2J are certain embodiments of a semiconductor structure 200B having a resistance variable memory structure at various stages of manufacture of the method 100 of FIG. 1. Some of the structures in FIGS. 2I to 2J may be substantially similar to the embodiments disclosed in FIGS. 2A to 2F and the description of the common structures are not repeated here although fully applicable in the following embodiments as well.

Referring to FIG. 2I, which is a cross-sectional view of a semiconductor structure 200B continued after the process operation in FIG. 2F. Details of the materials and fabrication methods of the semiconductor structure 200B before FIG. 2I can be found in the text associated with the semiconductor structure 200A in FIGS. 2A-2F and are not repeated here.

In FIG. 2I, a planarization process such as CMP is performed to remove the excess second electrode material 217 and the resistance variable layer 215 outside the opening 211 in FIG. 2F. The second electrode material 217 and the resistance variable layer 215 are patterned within the opening 211 through the planarization process to form a second electrode 217E over the first electrode 213E. Thus, a resistance variable memory structure 230 is formed.

The resistance variable memory structure 230 includes the first electrode 213E, a resistance variable layer 215A-B, a protection material 209 and the second electrode 217E. The first electrode 213E is surrounded by the etching stop layer 207 and the protection material 209. The resistance variable layer 215A-B has a first portion 215A and a second portion 215B. The first portion 215A is disposed over the top surface 213A of the first electrode 213E. The second portion 215B extends upwardly from the first portion 215A. The second electrode 217E is surrounded by the second portion 215B of the resistance variable layer. The protection material 209 has the interior sidewall surface 211A adjacent to the first outer sidewall surface 213B of the first electrode 213E and the second outer sidewall surface 211B of the second portion 215B of the resistance variable layer. The second electrode 217E, the second portion 215B of the resistance variable layer and the protection material 209 have a same substantially flat top surface 209A. The protection material 209 surrounds the first portion 215A and second portion 215B of the resistance variable layer, and a top portion of the first electrode 213E. The protection material 209 may prevent the lineup of the defect (e.g. oxygen) vacancies for conductive paths 250 in the second portion 215B disturbed by oxygen atoms from adjacent layers.

FIG. 2J is a cross-sectional view of the semiconductor structure 200B after forming an ILD layer 219 over top surface 209A of the protection material 209 and forming conductive wires 223A-B and contact plugs 221A-B in the memory region 201 and the periphery region 202. Details of the materials and fabrication methods of the semiconductor structure 200B in FIG. 2J can be found in the text associated with the semiconductor structure 200A in FIG. 2H and are not repeated here.

The conductive wires 223A-B in the memory region 201 and the periphery region 202 are in a same second metal line layer above an underlying first metal line layer. In the memory region 201, the resistance variable memory structure 230 is interposed between the first metal line layer and the second metal line layer. The contact plugs 221A contacts the second electrode E and connects to the conductive wires 223A in the second metal line layer. In the periphery region 202, none device structure is interposed between the first metal line layer and the second metal line layer. The device structure includes diode, transistor, PN junction, resistor, capacitor or inductor. The contact plug 221B connects the conductive wires 223B in the second metal line layer and the conductive structure 205. In some embodiments, the conductive structure 205 is a conductive wire in the first metal line layer. In certain embodiments, the conductive structure 205 is a contact plug above a conductive wire in the first metal line layer.

FIGS. 2K to 2L are some embodiments of a semiconductor structure 200C having a resistance variable memory structure at various stages of manufacture of the method 100 of FIG. 1. Referring to FIG. 2K, which is a cross-sectional view of a semiconductor structure 200C continued after the process operation in FIG. 2I. Details of the materials and fabrication methods of the semiconductor structure 200C before FIG. 2K can be found in the text associated with the semiconductor structure 200B in FIGS. 2A-2F and FIG. 2I. The description is not repeated here.

In FIG. 2K, a resistance variable memory structure 230 is formed in the memory region 201 by performing suitable patterning processes on the semiconductor structure 200B shown in FIG. 2I. The suitable patterning processes include lithography patterning and etching processes. The etching stop layer 207 may cease the etching processes further go down to the dielectric layers 203 and the conductive structure 205. In the periphery region 201, all the layers above the etching stop layer 207 are removed.

The resistance variable memory structure 230 includes the first electrode 213E, a resistance variable layer 215A-B, a protection material 209 and the second electrode 217E. The first electrode 213E is surrounded by the etching stop layer 207 and the protection material 209. The resistance variable layer 215A-B has a first portion 215A and a second portion 215B. The first portion 215A is disposed over the top surface 213A of the first electrode 213E. The second portion 215B extends upwardly from the first portion 215A. The second electrode 217E is surrounded by the second portion 215B of the resistance variable layer. The protection material 209 has the interior sidewall surface 211A and an outer sidewall surface 209B. The interior sidewall surface 211A is adjacent to the first outer sidewall surface 213B of the first electrode 213E and the second outer sidewall surface 211B of the second portion 215B of the resistance variable layer. The outer sidewall surface 209B is substantially parallel to the interior sidewall surface 211A. The second electrode 217E, the second portion 215B of the resistance variable layer and the protection material 209 have a same substantially flat top surface 209A. The protection material 209 surrounds the first portion 215A and second portion 215B of the resistance variable layer, and a top portion of the first electrode 213E. The protection material 209 may prevent the lineup of the defect (e.g. oxygen) vacancies for conductive paths 250 in the second portion 215B disturbed by oxygen atoms from adjacent layers.

FIG. 2L is a cross-sectional view of the semiconductor structure 200C after forming an ILD layer 219 over top surface 209A of the protection material 209 and forming conductive wires 223A-B and contact plugs 221A-B in the memory region 201 and the periphery region 202. Details of the materials and fabrication methods of the semiconductor structure 200C in FIG. 2K can be found in the text associated with the semiconductor structure 200A in FIG. 2H and are not repeated here.

The conductive wires 223A-B in the memory region 201 and the periphery region 202 are in a same second metal line layer above an underlying first metal line layer. In the memory region 201, the resistance variable memory structure 230 is interposed between the first metal line layer and the second metal line layer. The contact plugs 221A contacts the second electrode E and connects to the conductive wires 223A in the second metal line layer. In the periphery region 202, none device structure is interposed between the first metal line layer and the second metal line layer. The contact plug 221B connects the conductive wires 223B in the second metal line layer and the conductive structure 205.

One aspect of the disclosure describes a semiconductor structure includes a memory region. A memory structure is disposed on the memory region. The memory structure includes a first electrode, a resistance variable layer, a protection material and a second electrode. The first electrode has a top surface on the memory region. The resistance variable layer has at least a first portion and a second portion. The first portion is disposed over the top surface of the first electrode and the second portion extends upwardly from the first portion. The protection material surrounds the second portion of the resistance variable layer. The protection material is configurable to protect at least one conductive path in the resistance variable layer. The second electrode is disposed over the resistance variable layer.

A further aspect of the disclosure describes a semiconductor structure including a memory region. A memory structure is disposed on the memory region. The memory structure includes a first electrode, a resistance variable layer and a second electrode. The first electrode has a top surface and a first outer sidewall surface. The resistance variable layer has at least a first portion and a second portion. The first portion is disposed over the top surface of the first electrode. The second portion extends upwardly from the first portion and has a second outer sidewall surface substantially aligned the first outer sidewall surface of the first electrode. The second electrode is disposed over the resistance variable layer.

The present disclosure also describes an aspect of a method of forming a resistance variable memory structure. The method includes forming a protection material over a conductive structure. An opening is etched in the protection material to expose a portion of the conductive structure. The opening has a sidewall surface. The opening is partially filled with a first electrode material over the conductive structure to form a first electrode. The first electrode has a top surface and a first outer surface substantially aligned with the sidewall surface of the opening. A resistance variable layer is deposited in the opening over the first electrode. The resistance variable layer has a first portion and a second portion. The first portion is over the top surface of the first electrode. The second portion extends upwardly from the first portion and has a second outer surface substantially aligned with sidewall surface of the opening. A second electrode material is formed over the resistance variable layer. The second electrode material and the resistance variable layer are patterned to form a second electrode over the first electrode.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A semiconductor structure comprising:
    a memory region and a periphery region provided on a semiconductor substrate;
    a memory structure disposed on the memory region, the memory structure comprising:
        a first electrode having a top surface on the memory region;
        a resistance variable layer having at least a first portion, a second portion, wherein the first portion is disposed over the top surface of the first electrode and the second portion extends upwardly from the first portion and defines a cavity,
        a protection material having a top surface and a bottom surface, wherein the protection material is disposed surrounding the second portion of the resistance variable layer and a first portion of the first electrode, wherein a top surface of the first portion is separated from the protection material, wherein a lowest portion of the first electrode is below the bottom surface of the protection material, and wherein the protection material has a single, contiguous first composition extending from the top surface to the bottom surface; and
        a second electrode in the cavity, wherein an uppermost portion of the second electrode, the top surface of the protection material, and an uppermost portion of the resistance variable layer are substantially coplanar;
    a first contact plug interfacing the second electrode; and
    a second contact plug coplanar with the first contact plug and the first electrode and disposed in the periphery region, wherein an insulating material having a second composition interfaces sidewalls of the second contact plug, wherein the first and second compositions are different.

2. The semiconductor structure of claim 1, wherein the first portion of the resistance variable layer is selectively configurable to form the at least one conductive path between the first electrode and the second electrode.

3. The semiconductor structure of claim 1, wherein the single, contiguous first composition of the protection material is silicon nitride.

4. The semiconductor structure of claim 1, further comprising an etching stop layer surrounding a second portion of the first electrode.

5. The semiconductor structure of claim 4, wherein the etching stop layer is different from the first composition.

6. The semiconductor structure of claim 1, wherein the resistance variable layer comprises a high-k dielectric material, a binary metal oxide or a transition metal oxide.

7. The semiconductor structure of claim 1,
    a first metal line layer and an adjacent second metal line layer disposed on both the memory region and the peripheral region;
    wherein the memory structure is interposed between the first metal line layer and the second metal line layer in the memory region, and no device structure is interposed between the first metal line layer and the second metal line layer in the periphery region.

8. The semiconductor structure of claim 1, further comprising:
an etch stop layer under the protection material and the insulating material, wherein the etch stop layer has a direct interface to the protection material and the insulating material.

9. The semiconductor structure of claim 8, wherein the insulating material is disposed on the memory region and the periphery region and the direct interface is in the memory region.

10. The semiconductor structure of claim 9, further comprising: a second direct interface between the insulating material and the etch stop material in the periphery region.

11. A semiconductor structure comprising:
a memory region; and
a memory structure disposed on the memory region, the memory structure comprising:
a first electrode having a top surface, a bottom surface, and a first outer sidewall surface extending from the top surface to the bottom surface, wherein the first outer sidewall is a single lateral edge extending substantially perpendicular to the top surface;
a resistance variable layer having at least a first portion and a second portion, wherein the first portion is disposed directly on the top surface of the first electrode and the second portion extends upwardly from the first portion and has a second outer sidewall surface;
a protection material layer surrounding the resistance variable layer, wherein the protection material layer is a substantially oxygen free material extending from a top surface of the protection material layer to a bottom surface of the protection material layer, where the protection material layer interfaces with a first portion of the first outer sidewall surface, and wherein the bottom surface of the first electrode is disposed below a bottom surface of the protection material layer, the resistance variable layer is in direct contact with the substantially oxygen free material of the protection material layer; and
a second electrode disposed over the resistance variable layer, wherein the second electrode forms an interface with the first portion, and wherein a top surface of the second electrode is coplanar with the top surface of the protection material layer.

12. The semiconductor structure of claim 11, wherein the first portion of the resistance variable layer is selectively configurable to form at least one conductive path between the first electrode and the second electrode.

13. The semiconductor structure of claim 11, further comprising:
a periphery region; and
a first metal line layer and an adjacent second metal line layer disposed on both the periphery region and the memory region,
wherein the memory structure is interposed between the first metal line layer and the second metal line layer in the memory region, and no device component is interposed between the first metal line layer and the second metal line layer in the periphery region.

14. The semiconductor structure of claim 11, wherein the resistance variable layer comprises a third portion extends horizontally away from the second portion.

15. The semiconductor structure of claim 11, wherein the second electrode comprises a vertical portion extending into an opening surrounded by the second portion of the resistance variable layer, and a horizontal portion extending beyond the second outer sidewall surface of the second portion of the resistance variable layer.

16. The semiconductor structure of claim 11, wherein the protection material layer has a third sidewall surface substantially aligned with the first outer sidewall surface of the first electrode.

17. The semiconductor structure of claim 16, wherein the protection material layer is configurable to protect at least one conductive filament in the resistance variable layer.

18. The semiconductor structure of claim 16, the first composition of the protection material comprises silicon nitride.

19. A method of forming a resistance variable memory structure, the method comprising:
forming a protection material over a conductive structure and an etch stop layer;
etching an opening in the protection material and the etch stop layer to expose a portion of the conductive structure, the opening having a sidewall surface;
partially filling the opening with a first electrode material over the conductive structure to form a first electrode, the first electrode having a top surface and a first outer surface substantially aligned with the sidewall surface of the opening, wherein a lowest portion of the first electrode is below a lowest portion of the protection material;
depositing a resistance variable layer in the opening over the first electrode, wherein the resistance variable layer has a first portion over the top surface of the first electrode, and a second portion extending upwardly from the first portion and having a second outer surface substantially aligned with sidewall surface of the opening;
forming a second electrode material over the resistance variable layer;
patterning the second electrode material and the resistance variable layer to form a second electrode over the first electrode, wherein the second electrode forms an interface with the first portion; and
after forming the second electrode material, removing a portion of the protection material to expose a portion of the etch stop layer.

20. The method of claim 19, wherein the removing the portion of the protection material includes removing the protection material from a periphery region of a semiconductor substrate.

* * * * *